United States Patent
Chen et al.

(10) Patent No.: US 9,023,676 B2
(45) Date of Patent: May 5, 2015

(54) WAFER PACKAGING METHOD

(71) Applicant: Xintec Inc., Zhongli, Taoyuan County (TW)

(72) Inventors: Chih-Hao Chen, Zhongli (TW); Bai-Yao Lou, Taipei (TW); Shih-Kuang Chen, Kaohsiung (TW)

(73) Assignee: Xintec Inc., Taoyuan (TW)

( * ) Notice: Subject to any disclaimer, the term of this patent is extended or adjusted under 35 U.S.C. 154(b) by 0 days.

(21) Appl. No.: 14/166,749

(22) Filed: Jan. 28, 2014

(65) Prior Publication Data

US 2014/0213010 A1 Jul. 31, 2014

Related U.S. Application Data (60) Provisional application No. 61/758,417, filed on Jan. 30, 2013.

(51) Int. Cl.
*H01L 21/00* (2006.01)
*H01L 27/146* (2006.01)
*H01L 21/20* (2006.01)

(52) U.S. Cl.
CPC ....... *H01L 27/14687* (2013.01); *H01L 21/2007* (2013.01); *H01L 27/14618* (2013.01)

(58) Field of Classification Search
None
See application file for complete search history.

(56) References Cited

U.S. PATENT DOCUMENTS

| | | | |
|---|---|---|---|
| 2005/0142815 A1* | 6/2005 | Miyazaki et al. | 438/464 |
| 2011/0189808 A1* | 8/2011 | Watanabe et al. | 438/66 |
| 2012/0012989 A1* | 1/2012 | Sato et al. | 257/632 |

* cited by examiner

Primary Examiner — Angel Roman
(74) Attorney, Agent, or Firm — Liu & Liu (57) ABSTRACT

A wafer packaging method includes the following steps. A light transmissive carrier is provided. A hydrolytic temporary bonding layer is formed on the light transmissive carrier. A first surface of a light transmissive protection sheet is bonded to the hydrolytic temporary bonding layer, such that the hydrolytic temporary bonding layer is located between the light transmissive protection sheet and the light transmissive carrier. A second surface of the light transmissive protection sheet facing away from the first surface is bonded to a third surface of a wafer. The light transmissive carrier, the hydrolytic temporary bonding layer, the light transmissive protection sheet, and the wafer are immersed in a high temperature liquid, such that adhesion force of the hydrolytic temporary bonding layer is eliminated. The light transmissive protection sheet and the wafer are obtained from the high temperature liquid.

14 Claims, 13 Drawing Sheets

WAFER PACKAGING METHOD

RELATED APPLICATIONS

This application claims priority to U.S. provisional Application Ser. No. 61/758,417, filed Jan. 30, 2013, which is herein incorporated by reference.

BACKGROUND

1. Field of Invention

The present invention relates to a wafer packaging method.

2. Description of Related Art

With the advance in glass cutting technology, glass manufacturers are able to manufacture glass sheets with thickness under 400 μm. When an image sensor wafer, e.g., a CMOS wafer, is packaged, a glass sheet is needed to cover the surface of the wafer for the wafer protection. Although a thinner glass sheet can provide a better light transmittance and improved image detecting ability of chips formed from the diced wafer, the strength of the thin glass is more likely of lacking mechanical strength and having warpage, so as to increase the difficulty in the manufacturing process of the wafer.

Figure 1A:
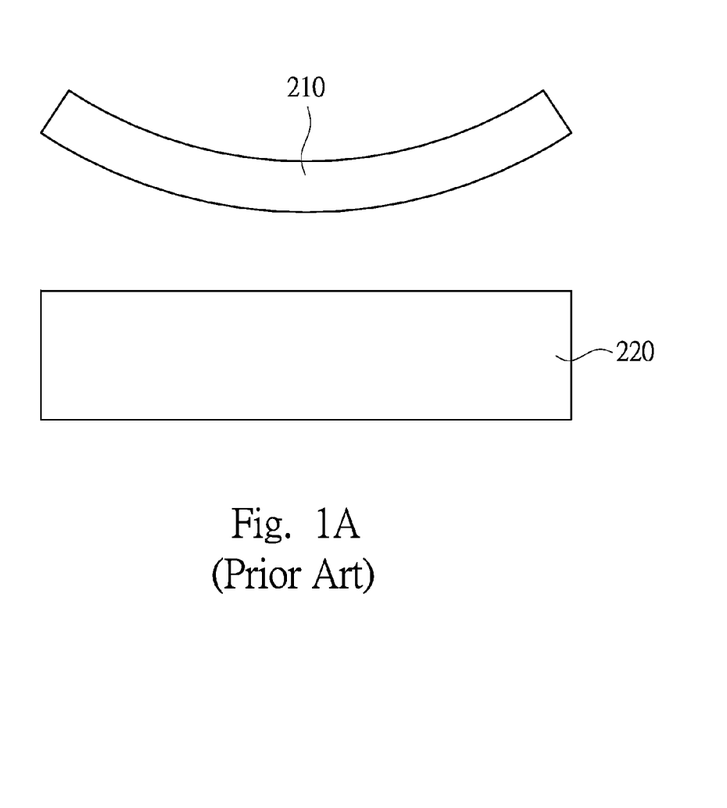
FIG. 1A is a schematic view of a glass sheet when being adhered to a wafer in the prior art.
Figure 1B:
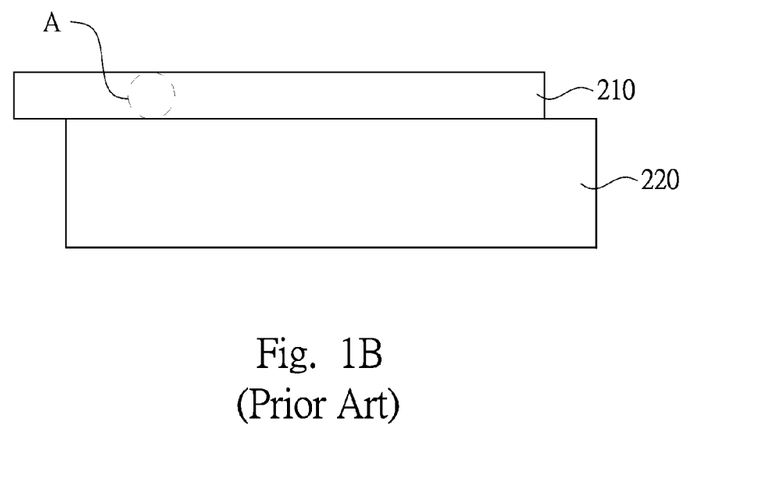
FIG. 1B is a schematic view of the glass sheet shown in FIG. 1A in a state of being adhered to the wafer.

FIG. 1A is a schematic view of a glass sheet 210 when being adhered to a wafer 220 in the prior art. FIG. 1B is a schematic view of the glass sheet 210 shown in FIG. 1A in a state of being adhered to the wafer 220. As shown in FIG. 1A and FIG. 1B, due to the small thickness of the glass sheet 210, the warpage of the glass sheet 210 may happen before the glass sheet 210 is placed on the wafer 220. It is difficult to align the glass sheet 210 with the wafer 220, which may introduce a shift of the glass sheet 210 on the wafer 220. As a result, the glass sheet 210 may protrude from the wafer 220 by one side, and an area A in the figure is easily cracked.

Figure 2A:
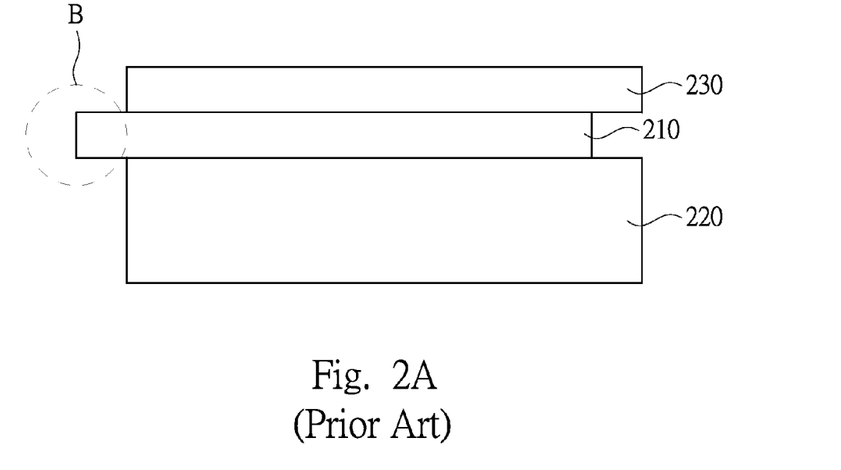
FIG. 2A is a schematic view of the glass sheet shown in FIG. 1B in a state of being adhered to a tape.
Figure 2B:
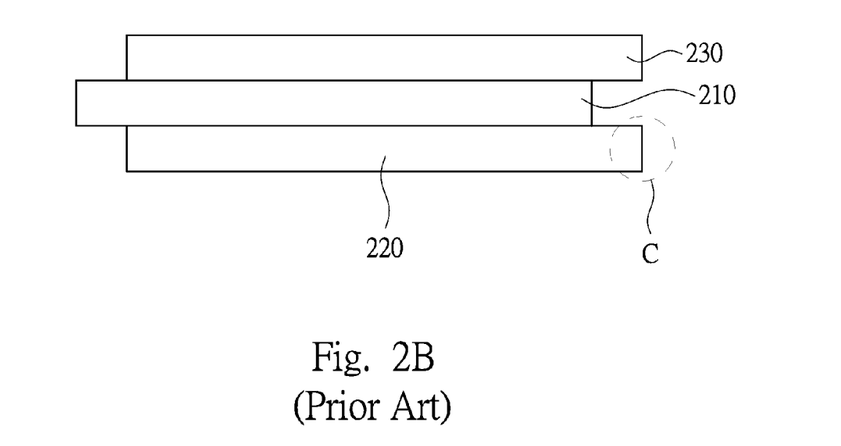
FIG. 2B is a schematic view of the wafer shown in FIG. 2A after being ground.

FIG. 2A is a schematic view of the glass sheet 210 shown in FIG. 1B in a state of being adhered to a tape 230. FIG. 2B is a schematic view of the wafer 220 shown in FIG. 2A after being ground (referred to as the verb tense of the word "grind"). As shown in FIG. 2A and FIG. 2B, after the glass sheet 210 is adhered to the wafer 220, the tape 230 for increasing strength is first required to adhere to the glass sheet 210, and then to perform a grinding process on the wafer 220. However, since the glass sheet 210 is not precisely aligned with the wafer 220, it is easily, in cutting the tape 230, to crack the area B of the glass sheet 210 protruding from the wafer 220, so as the area C of the wafer 220 protruding from the glass sheet 210.

SUMMARY

An aspect of the present invention is to provide a wafer packaging method.

According to one embodiment of the present invention, a wafer packaging method includes the following steps. (a) A light transmissive carrier is provided. (b) A hydrolytic temporary bonding layer is formed on the light transmissive carrier. (c) A first surface of a light transmissive protection sheet is bonded to the hydrolytic temporary bonding layer, such that the hydrolytic temporary bonding layer is located between the light transmissive protection sheet and the light transmissive carrier. (d) A second surface of the light transmissive protection sheet facing away from the first surface is bonded to a third surface of a wafer, and the third surface of the wafer has a plurality of integrated circuit units. (e) The light transmissive carrier, the hydrolytic temporary bonding layer, the light transmissive protection sheet, and the wafer are immersed in a high temperature liquid, such that the adhesion force of the hydrolytic temporary bonding layer is eliminated. (f) The light transmissive protection sheet and the wafer are obtained from the high temperature liquid.

In one embodiment of the present invention, the wafer packaging method further includes: a first dam layer is formed on the light transmissive carrier. The first dam layer and the hydrolytic temporary bonding layer are located on the same surface of the light transmissive carrier, and the first dam layer does not overlap with the hydrolytic temporary bonding layer.

In one embodiment of the present invention, the thickness of the first dam layer is smaller than the thickness of the hydrolytic temporary bonding layer.

In one embodiment of the present invention, the wafer packaging method further includes: a second dam layer is formed on the second surface of the light transmissive protection sheet.

In one embodiment of the present invention, the wafer packaging method further includes: a fourth surface of the wafer facing away from the third surface is ground.

In one embodiment of the present invention, the wafer packaging method further includes: a frame body having an ultraviolet tape is provided. The ultraviolet tape is located in the opening of the frame body. The ground fourth surface of the wafer is adhered to the ultraviolet tape.

In one embodiment of the present invention, the wafer packaging method further includes: the light transmissive protection sheet and the ground wafer is diced, such that the diced light transmissive protection sheet and the diced wafer forms a plurality of image sensors.

In one embodiment of the present invention, the wafer packaging method further includes: the ultraviolet tape is exposed to ultraviolet, such that the adhesion force of the ultraviolet tape is eliminated. The image sensors are obtained from the ultraviolet tape.

In one embodiment of the present invention, each of the image sensors is a CMOS image sensing chip.

In one embodiment of the present invention, the hydrolytic temporary bonding layer is made of a material that includes acrylic.

In one embodiment of the present invention, the thickness of the light transmissive protection sheet is in a range from 50 to 500 μm.

In one embodiment of the present invention, the thickness of the light transmissive carrier is in a range from 300 to 500 μm.

In one embodiment of the present invention, the thickness of the light transmissive carrier is greater than the thickness of the light transmissive protection sheet.

In one embodiment of the present invention, the strength of the light transmissive carrier is greater than the strength of the light transmissive protection sheet.

In the aforementioned embodiments of the present invention, the hydrolytic temporary bonding layer is utilized to adhere the light transmissive protection sheet and the light transmissive carrier in the wafer packaging method. The strength of the light transmissive carrier is sufficient to prevent the light transmissive protection sheet from warpage when the light transmissive protection sheet is adhered to the wafer. As a result, since when the light transmissive protection sheet is adhered to the wafer, the warpage of the light transmissive protection sheet is not easily happened, and the light transmissive carrier can be attached by static electricity and has transmittance, the light transmissive protection sheet can be easily aligned with the wafer and does not shift on the wafer. When the wafer is ground, the strength of the light transmissive protection sheet and the wafer is increased by the light transmissive carrier, such that the light transmissive protection sheet and the wafer are not easily broken. In addition, the adhesion force of the hydrolytic temporary bonding layer is eliminated in high temperature liquid. Therefore, after the wafer is ground, the light transmissive carrier can be easily separated from the light transmissive protection sheet.

Since the strength of the light transmissive protection sheet and the wafer can be increased by the light transmissive carrier, the tape adhering process in the prior art can be omitted. The wafer packaging method can use a significantly thin light transmissive protection sheet to improve the transmittance thereof, such that the image detecting ability of chips formed by the diced wafer can be improved. Moreover, when the wafer is ground, the ground thickness of the wafer can be flexibly adjusted.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 3:
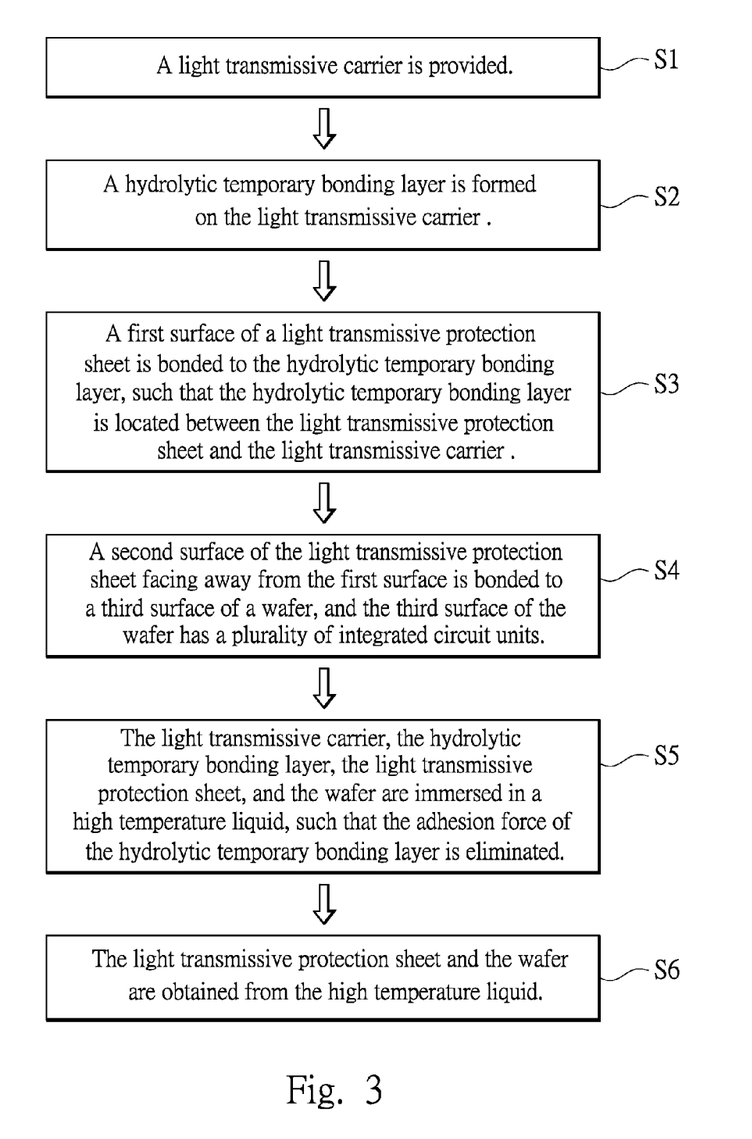
FIG. 3 is a flow chart of a wafer packaging method according to one embodiment of the present invention.

FIG. 3 is a flow chart of a wafer packaging method according to one embodiment of the present invention. In step S1, a light transmissive carrier is provided. Thereafter in step S2, a hydrolytic temporary bonding layer is formed on the light transmissive carrier. Next in step S3, a first surface of a light transmissive protection sheet is bonded to the hydrolytic temporary bonding layer, such that the hydrolytic temporary bonding layer is located between the light transmissive protection sheet and the light transmissive carrier. Thereafter in step S4, a second surface of the light transmissive protection sheet facing away from the first surface is bonded to a third surface of a wafer, and the third surface of the wafer has a plurality of integrated circuit units. Next in step S5, the light transmissive carrier, the hydrolytic temporary bonding layer, the light transmissive protection sheet, and the wafer are immersed in a high temperature liquid, such that the adhesion force of the hydrolytic temporary bonding layer is eliminated. Finally in step S6, the light transmissive protection sheet and the wafer are obtained from the high temperature liquid.

In the following descriptions, the aforesaid steps of the wafer packaging method will be described in detail.

Figure 4A:
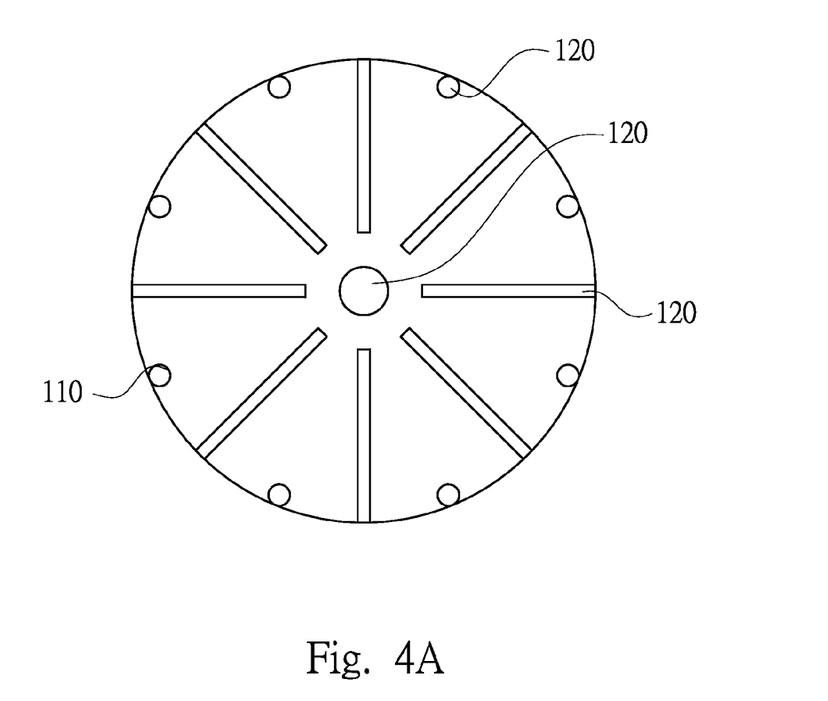
FIG. 4A is a top view of a first dam layer after being formed on a light transmissive carrier according to one embodiment of the present invention.
Figure 4B:
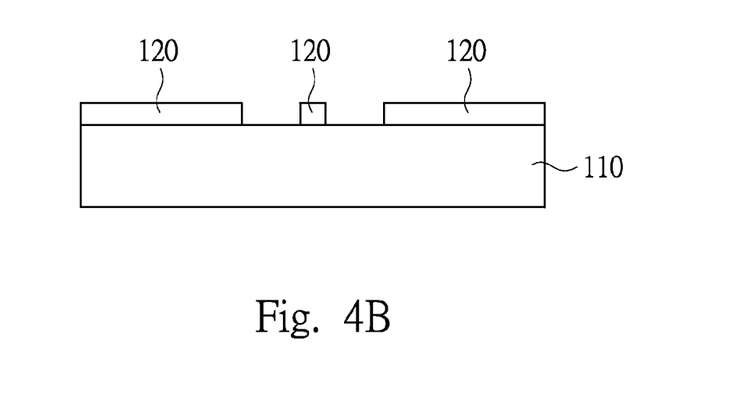
FIG. 4B is a schematic view of the first dam layer and the light transmissive carrier shown in FIG. 4A.

FIG. 4A is a top view of a first dam layer 120 after being formed on a light transmissive carrier 110 according to one embodiment of the present invention. FIG. 4B is a schematic view of the first dam layer 120 and the light transmissive carrier 110 shown in FIG. 4A. As shown in FIG. 4A and FIG. 4B, the first dam layer 120 may be formed on the light transmissive carrier 110 by a photolithography process. The arrangement of the first dam layer 120 can be determined by designers depending on practical requirements, and is not limited by the arrangement shown in FIG. 4A.

In this embodiment, the light transmissive carrier 110 may be a glass board, and the thickness of the light transmissive carrier 110 may be in a range from 300 to 500 μm, such as 400 μm. The light transmissive carrier 110 is light permeable and attached through static electricity. The first dam layer 120 may be made of a material that includes epoxy. However, in other embodiment, the light transmissive carrier 110 and the first dam layer 120 can be made of other materials, and the present invention is not limited in this regard.

Figure 5A:
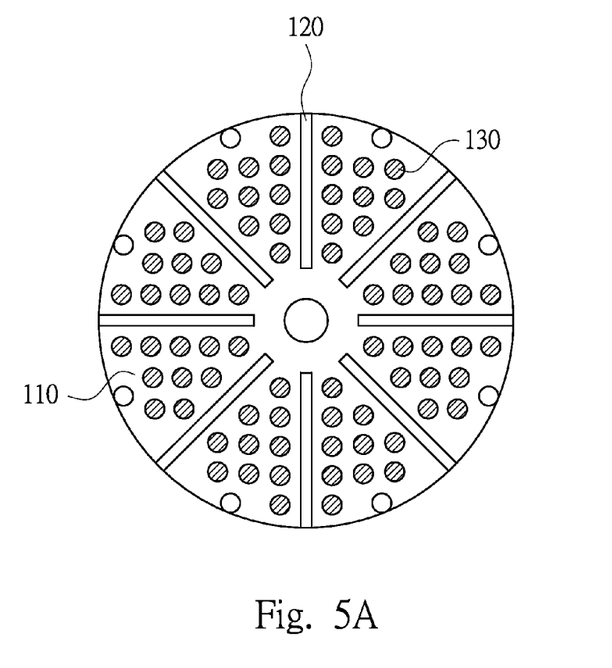
FIG. 5A is a top view of a hydrolytic temporary bonding layer after being formed on the light transmissive carrier shown in FIG. 4A.
Figure 5B:
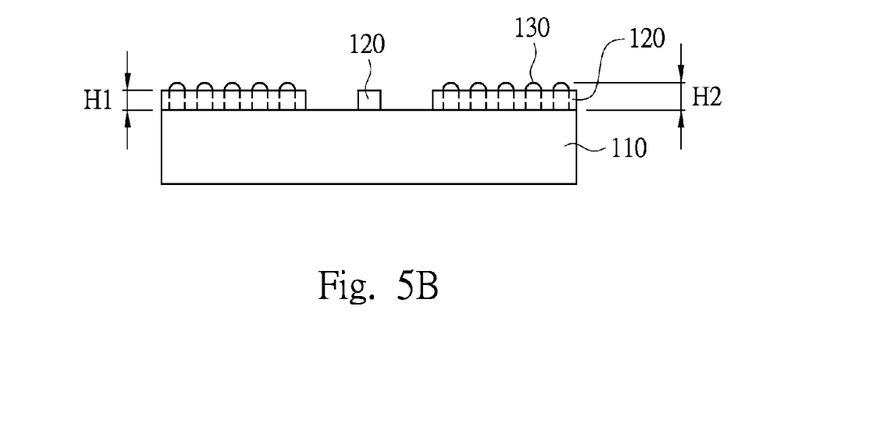
FIG. 5B is a schematic view of the hydrolytic temporary bonding layer, the light transmissive carrier, and the first dam layer shown in FIG. 5A.

FIG. 5A is a top view of a hydrolytic temporary bonding layer 130 after being formed on the light transmissive carrier 110 shown in FIG. 4A. FIG. 5B is a schematic view of the hydrolytic temporary bonding layer 130, the light transmissive carrier 110, and the first dam layer 120 shown in FIG. 5A. As shown in FIG. 5A and FIG. 5B, the hydrolytic temporary bonding layer 130 can be formed on the light transmissive carrier 110 by a screen printing process. The first dam layer 120 and the hydrolytic temporary bonding layer 130 are located on the same surface of the light transmissive carrier 110, and the first dam layer 120 does not overlap with the hydrolytic temporary bonding layer 130. The thickness H1 (e.g., 30 μm) of the first dam layer 120 is smaller than the thickness H2 (e.g., 40 μm) of the hydrolytic temporary bonding layer 130. The hydrolytic temporary bonding layer 130 can be dissolved in a high temperature liquid (e.g., 50-100° C. hot water) to eliminate its adhesion force. The arrangement of the hydrolytic temporary bonding layer 130 can be determined by designers depending on practical requirements, and is not limited by the arrangement shown in FIG. 5A.

In this embodiment, the hydrolytic temporary bonding layer 130 may made of a material that includes acrylic, but the present invention is not limited in this regard.

Figure 6:
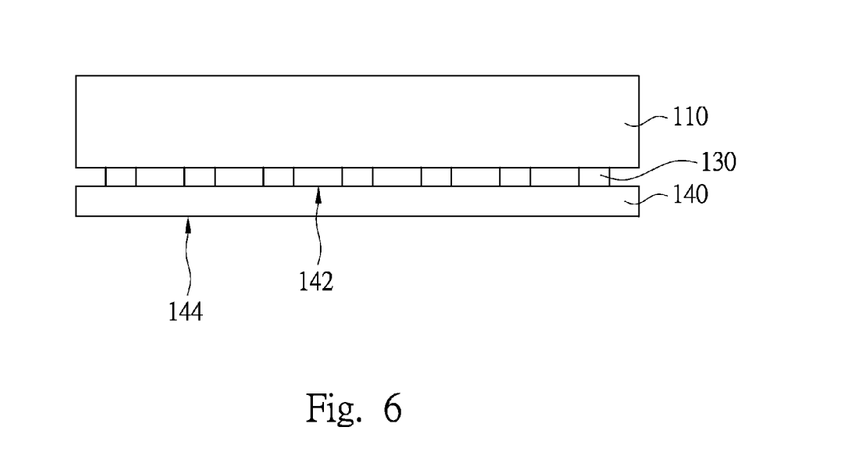
FIG. 6 is a schematic view of the hydrolytic temporary bonding layer shown in FIG. 5B after being adhered to a light transmissive protection sheet.

FIG. 6 is a schematic view of the hydrolytic temporary bonding layer 130 shown in FIG. 5B after being adhered to a light transmissive protection sheet 140. Since the first dam layer 120 and the hydrolytic temporary bonding layer 130 are located on the same surface of the light transmissive carrier 110, in order to simplify the drawings, the first dam layer 120 is not shown in FIGS. 6 to 11C. The light transmissive protection sheet 140 has a first surface 142 and a second surface 144 opposite to the first surface 142. The first surface 142 of the light transmissive protection sheet 140 is adhered to the hydrolytic temporary bonding layer 130, such that the hydrolytic temporary bonding layer 130 is located between the light transmissive protection sheet 140 and the light transmissive carrier 110. Moreover, the gaps between the light transmissive protection sheet 140 and the light transmissive carrier 110 is formed by the first dam layer 120 (see FIG. 5B), and a high temperature liquid can flow into the gaps, such that the adhesion force of the hydrolytic temporary bonding layer 130 is eliminated.

In this embodiment, the light transmissive protection sheet 140 may be a glass board. The thickness of the light transmissive protection sheet 140 may be 100 μm, and the light transmissive protection sheet 140 has transmittance. However, in other embodiments, the thickness of the light transmissive protection sheet 140 may be in a range from 50 to 500 μm, and the present invention is not limited in this regard. Furthermore, when the materials of the light transmissive protection sheet 140 and the light transmissive carrier 110 are the same, the thickness of the light transmissive carrier 110 is greater than the thickness of the light transmissive protection sheet 140. When the materials of the light transmissive protection sheet 140 and the light transmissive carrier 110 are different, the strength of the light transmissive carrier 110 is greater than the strength of the light transmissive protection sheet 140.

Figure 7:
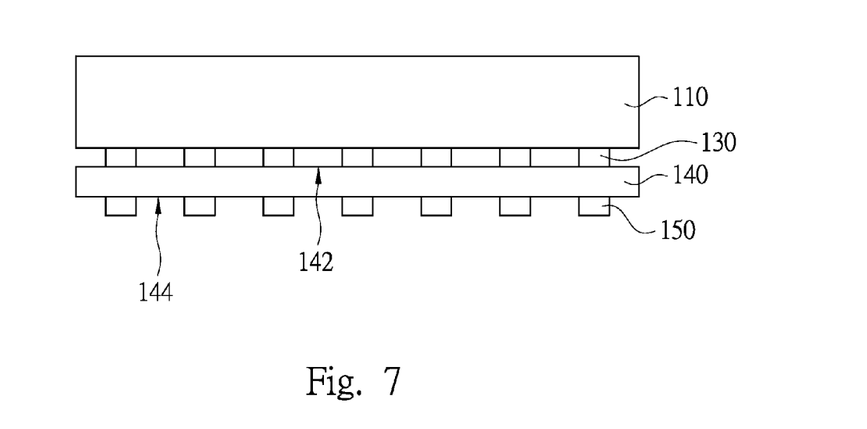
FIG. 7 is a schematic view of a second dam layer after being formed on the light transmissive protection sheet shown in FIG. 6.

FIG. 7 is a schematic view of a second dam layer 150 after being formed on the light transmissive protection sheet 140 shown in FIG. 6. The second dam layer 150 is formed on the second surface 144 of the light transmissive protection sheet 140, and the material of the second dam layer 150 may be the same as the first dam layer 120 (see FIG. 5B), such as epoxy.

Figure 8:
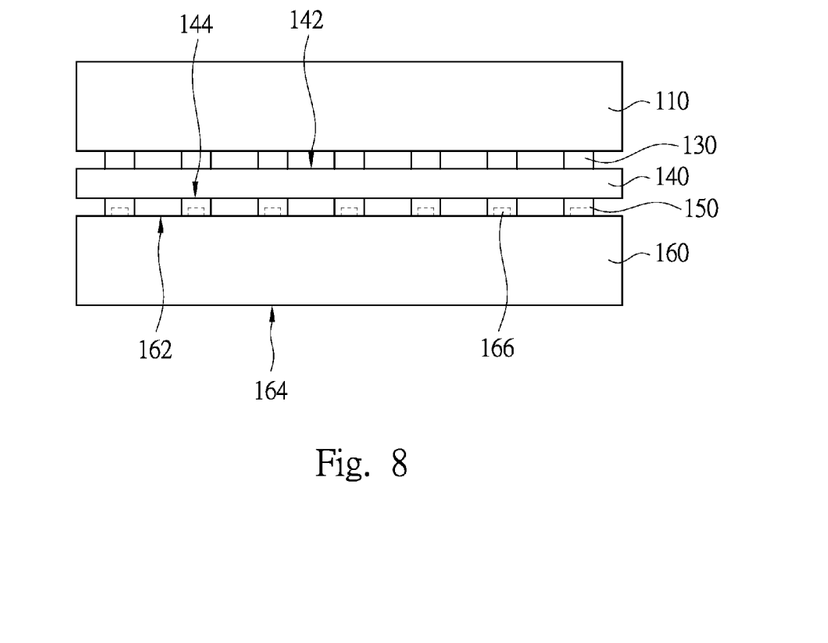
FIG. 8 is a schematic view of the light transmissive protection sheet shown in FIG. 7 after being adhered to the wafer.

FIG. 8 is a schematic view of the light transmissive protection sheet 140 shown in FIG. 7 after being adhered to the wafer 160. The wafer 160 has a third surface 162 and a fourth surface 164 opposite to the third surface 162. The wafer 160 may be made of a material that includes silicon. In this embodiment, the third surface 162 of the wafer 160 have formed a plurality of integrated circuit units 166 for detecting images. The second surface 144 of the light transmissive protection sheet 140 is adhered to the third surface 162 of the wafer 160. The strength of the light transmissive carrier 110 is sufficient to prevent the light transmissive protection sheet 140 from warpage when the light transmissive protection sheet 140 is adhered to the wafer 160. When the light transmissive protection sheet 140 is adhered to the wafer 160, since the warpage of the light transmissive protection sheet 140 is not easily happened, and the light transmissive protection sheet 140 can be attached by static electricity and has transmittance, it is easily aligned with the wafer 160. As a result, when the light transmissive protection sheet 140 is adhered to the wafer 160, the light transmissive protection sheet 140 does not shift on the wafer 160. The light transmissive carrier 110 can be attached by an electrostatic chuck (e-chuck), such that the convenience of the manufacturing process is improved.

In FIG. 8, the integrated circuit units 166 are shielded by the second dam layer 150. That is to say, the integrated circuit units 166 are located behind the second dam layer 150. In order to simplify the drawings, the integrated circuit units 166 are not shown in FIGS. 9 to 15.

Figure 9:
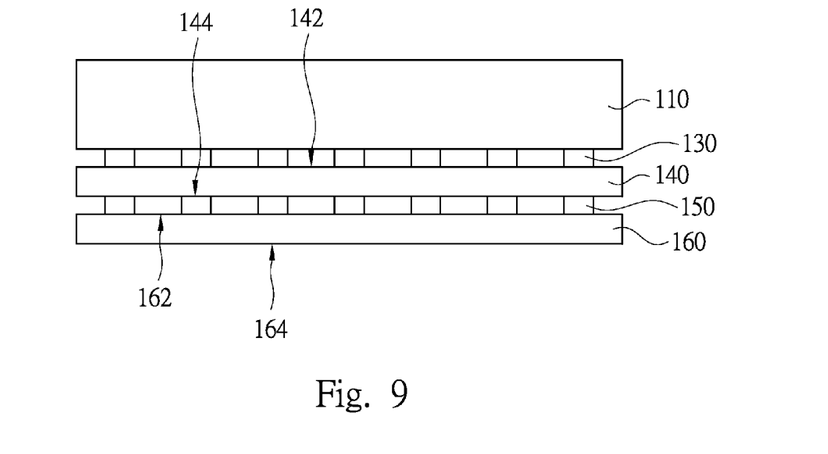
FIG. 9 is a schematic view of the wafer shown in FIG. 8 after being ground.

FIG. 9 is a schematic view of the wafer 160 shown in FIG. 8 after being ground. Compared with the thickness of the wafer 160 shown in FIG. 8, the fourth surface 164 of the wafer 160 after being ground is thinner, as shown in FIG. 9. When the wafer 160 is ground, the strength of the light transmissive protection sheet 140 and the wafer 160 can be increased by the light transmissive carrier 110, such that the light transmissive protection sheet 140 and the wafer 160 are not easily broken. Furthermore, since the strength of the light transmissive protection sheet 140 and the wafer 160 can be increased by the light transmissive carrier 110, the tape adhering process in the prior art can be omitted. Compared with a conventional wafer packaging method, the wafer packaging method of the present invention can use a significantly thin light transmissive protection sheet 140 to improve the transmittance thereof, such that the image detecting ability of chips formed by the diced wafer can be improved. Moreover, when the wafer 140 is ground, the ground thickness of the wafer can be flexibly adjusted.

Figure 10:
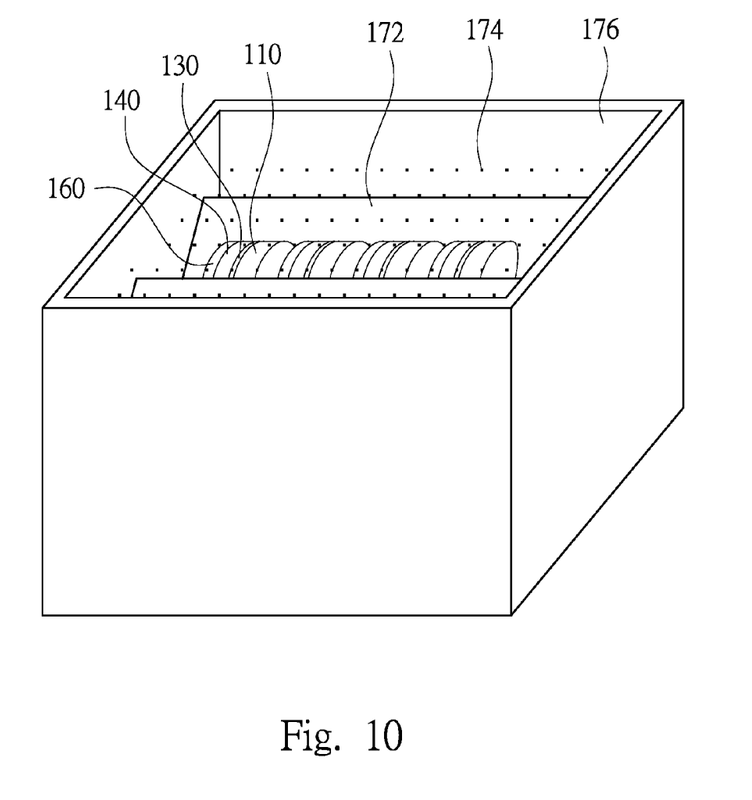
FIG. 10 is a perspective view of the light transmissive carrier, the hydrolytic temporary bonding layer, the light transmissive protection sheet, and the wafer shown in FIG. 9 when being immersed in a high temperature liquid.

FIG. 10 is a perspective view of the light transmissive carrier 110, the hydrolytic temporary bonding layer 130, the light transmissive protection sheet 140, and the wafer 160 shown in FIG. 9 when being immersed in a high temperature liquid 174. The hydrolytic temporary bonding layer 130 is utilized to adhere the light transmissive protection sheet 140 and the light transmissive carrier 110 in the wafer packaging method. After the wafer 160 is ground, the light transmissive carrier 110, the hydrolytic temporary bonding layer 130, the light transmissive protection sheet 140, and the ground wafer 160 can be immersed in the high temperature liquid 174, such that the adhesion force of the hydrolytic temporary bonding layer 130 is eliminated. The high temperature liquid 174 can be flow into the gaps formed by the first dam layer 120 (see FIG. 5B) between the light transmissive carrier 110 and the light transmissive protection sheet 140, such that the high temperature liquid 174 can be adequately in the hydrolytic temporary bonding layer 130.

That is to say, after the wafer 160 is ground, the adhesion force of the hydrolytic temporary bonding layer 130 can be eliminated in the high temperature liquid 174, such that the light transmissive carrier 110 can be separated from the light transmissive protection sheet 140. As a result, the adhered light transmissive protection sheet 140 and wafer 160 can be obtained from the high temperature liquid 174, such that the adhered light transmissive protection sheet 140 and wafer 160 can be shipped with wafer level to downstream industries.

In this embodiment, when the adhered light transmissive carrier 110, light transmissive protection sheet 140 and wafer 160 are immersed in the high temperature liquid 174, the adhered light transmissive carrier 110, light transmissive protection sheet 140 and wafer 160 are located in a cassette 172, and the high temperature liquid 174 is in a container 176. The cassette 172 and the container 176 do not limit the present invention, and the manufacturer can use other types of carrier.

Figure 11A:
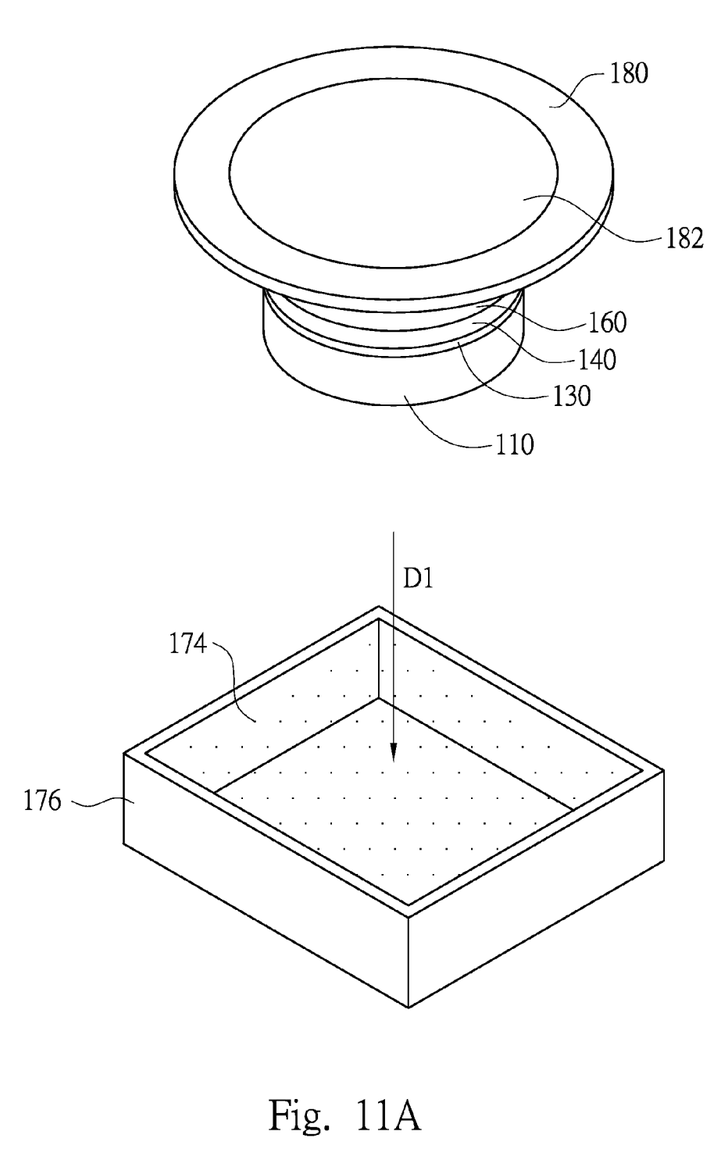
FIG. 11A is a perspective view of the wafer shown in FIG. 9 when being adhered to an ultraviolet tape of a frame body.

FIG. 11A is a perspective view of the wafer 160 shown in FIG. 9 when being adhered to an ultraviolet tape 182 of a frame body 180. As shown in FIG. 9 and FIG. 11A, the frame body 180 has the ultraviolet tape 182, and the ultraviolet tape 182 is located in a hollow opening of the frame body 180. After the wafer 160 is ground, the fourth surface 164 of the wafer 160 can be adhered to the ultraviolet tape 182. When the ultraviolet tape 182 is exposed to ultraviolet, the adhesion force of the ultraviolet tape 182 would be eliminated.

In this embodiment, the high temperature liquid 174 is in the container 176. The frame body 180 can be placed on the edge of the container 176 in a direction D1, such that the light transmissive carrier 110, the hydrolytic temporary bonding layer 130, the light transmissive protection sheet 140, and the ground wafer 160 are immersed in the high temperature liquid 174, as shown in FIG. 11B.

Figure 11B:
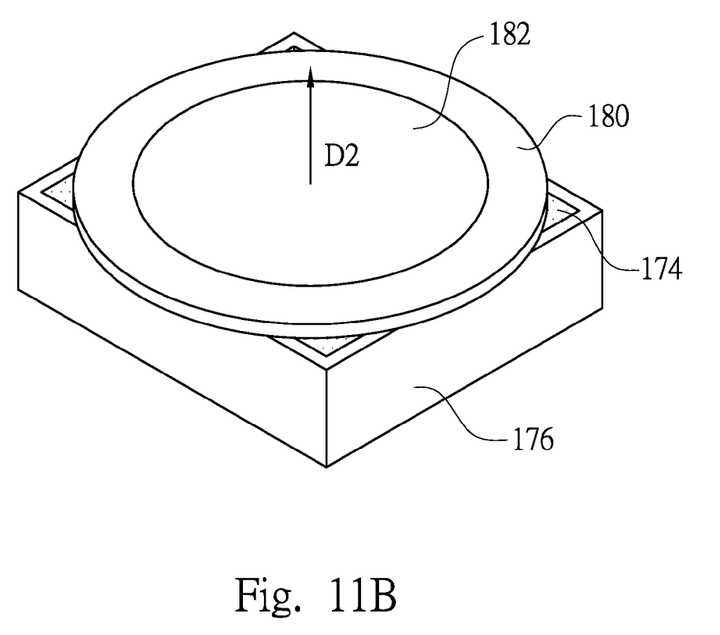
FIG. 11B is a perspective view of the light transmissive carrier, the hydrolytic temporary bonding layer, the light transmissive protection sheet, and the wafer shown in FIG. 11A when being immersed in the high temperature liquid.
Figure 11C:
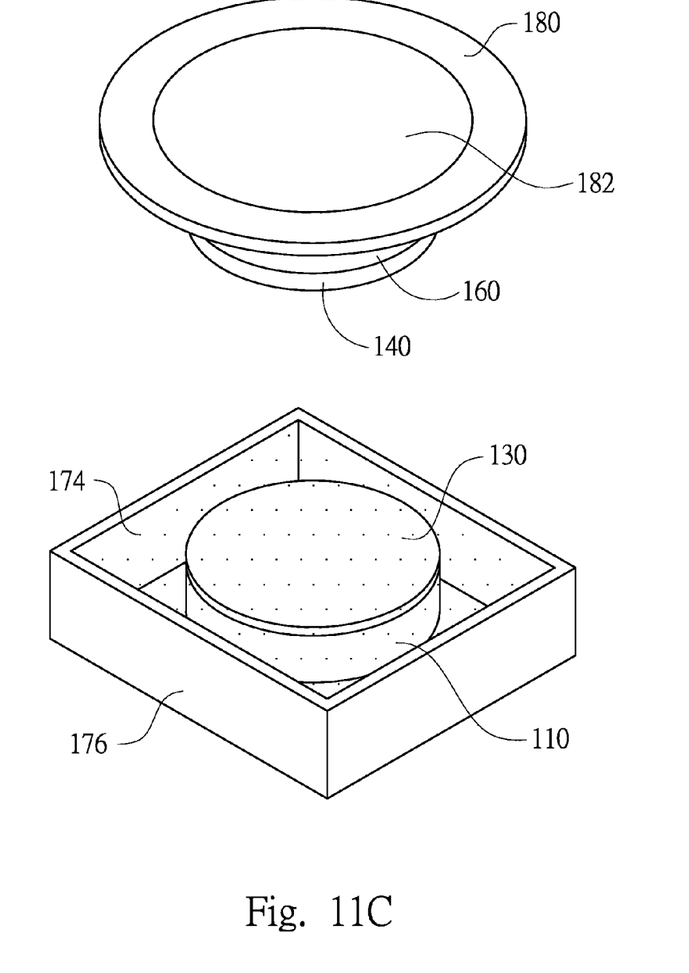
FIG. 11C is a perspective view of the light transmissive protection sheet and the wafer shown in FIG. 11B after being obtained from the high temperature liquid.

FIG. 11B is a perspective view of the light transmissive carrier 110, the hydrolytic temporary bonding layer 130, the light transmissive protection sheet 140, and the wafer 160 shown in FIG. 11A when being immersed in the high temperature liquid 174. FIG. 11C is a perspective view of the light transmissive protection sheet 140 and the wafer 160 shown in FIG. 11B after being obtained from the high temperature liquid 174. As shown in FIG. 11B and FIG. 11C, when the light transmissive carrier 110, the hydrolytic temporary bonding layer 130, the light transmissive protection sheet 140, and the wafer 160 are immersed in the high temperature liquid 174, the high temperature liquid 174 can be flow into the gaps formed by the first dam layer 120 (see FIG. 5B) between the light transmissive carrier 110 and the light transmissive protection sheet 140, such that the high temperature liquid 174 can be adequately in the hydrolytic temporary bonding layer 130.

After the adhesion force of the hydrolytic temporary bonding layer 130 is eliminated, the frame body 180 can be separated from the container 176 in a direction D2. As a result, the light transmissive carrier 110 is separated from the light transmissive protection sheet 140 and falls in the high temperature liquid 174, while the adhered light transmissive protection sheet 140 and wafer 160 can be moved with the frame body 180, such that the light transmissive protection sheet 140 and the wafer 160 can be obtained from the high temperature liquid 174.

Figure 12:
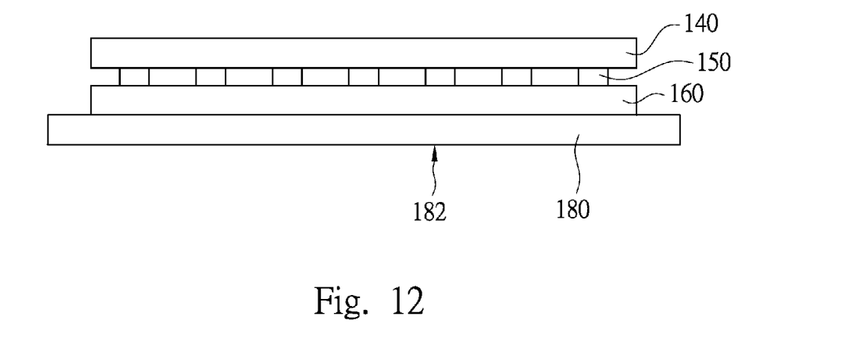
FIG. 12 is a schematic view of the light transmissive protection sheet, the wafer, and the frame body shown in FIG. 11C.
Figure 13:
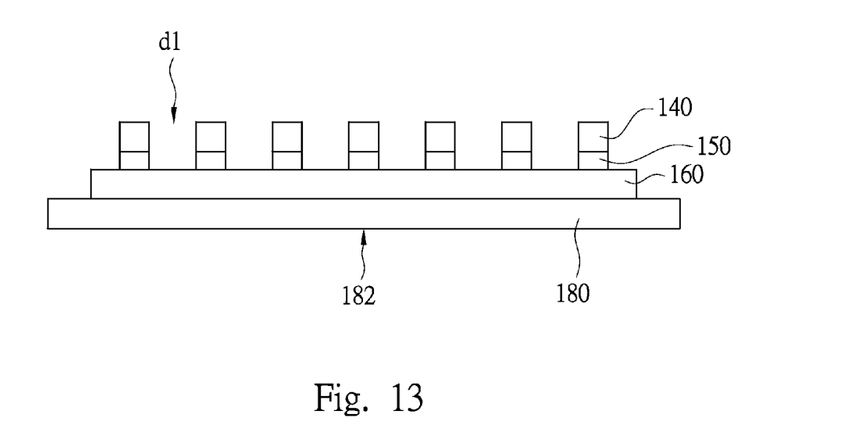
FIG. 13 is a schematic view of the light transmissive protection sheet shown in FIG. 12 after being diced.

FIG. 12 is a schematic view of the light transmissive protection sheet 140, the wafer 160, and the frame body 180 shown in FIG. 11C. FIG. 13 is a schematic view of the light transmissive protection sheet 140 shown in FIG. 12 after being diced. As shown in FIG. 12 and FIG. 13, after the light transmissive protection sheet 140 and the wafer 160 are obtained from the high temperature liquid 174, the light transmissive protection sheet 140 and the wafer 160 remain adhering to the ultraviolet tape 182. The light transmissive protection sheet 140 can be diced (cut) to form plural gaps d1.

Figure 14:
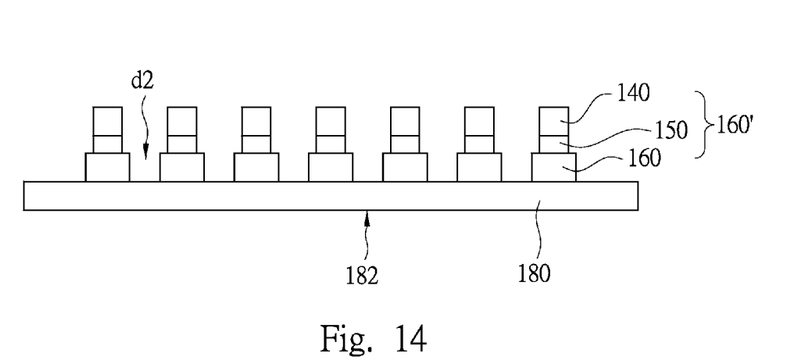
FIG. 14 is a schematic view of the wafer shown in FIG. 13 after being diced.

FIG. 14 is a schematic view of the wafer 160 shown in FIG. 13 after being diced. After the light transmissive protection sheet 140 is diced, the wafer 160 can also be diced to form plural gaps d2. In addition, the diced light transmissive protection sheet 140 and the diced wafer 160 may form plural image sensors 160'.

Figure 15:
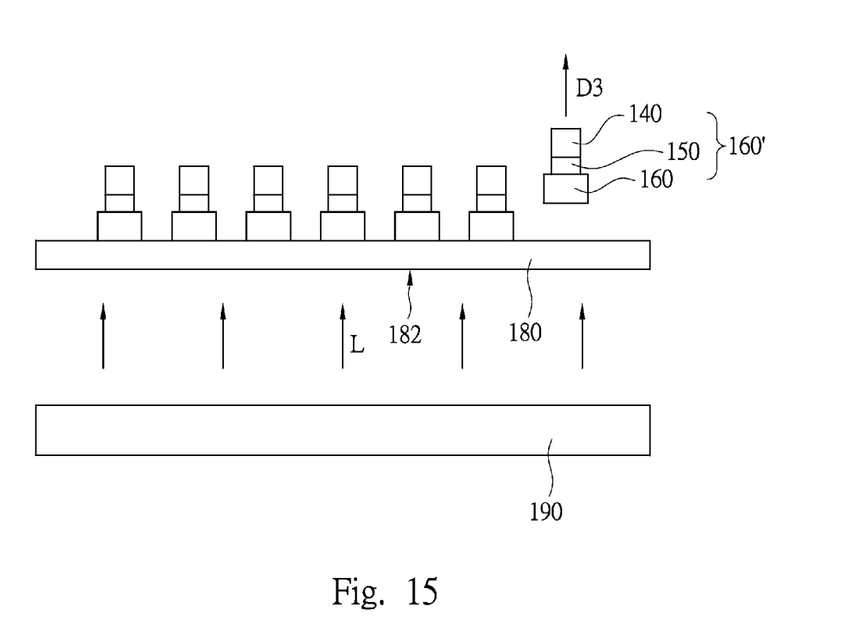
FIG. 15 is a schematic view of the ultraviolet tape of the frame body shown in FIG. 14 when being exposed to ultraviolet.

FIG. 15 is a schematic view of the ultraviolet tape 182 of the frame body 180 shown in FIG. 14 when being exposed to ultraviolet L. After the wafer 160 is diced, the frame body 180 may be located above an ultraviolet device 190, such that the ultraviolet tape 182 of the frame body 180 is exposed to the ultraviolet L. As a result, the adhesion force of the ultraviolet tape 182 of the frame body 180 is eliminated, such that the image sensors 160' (i.e., the diced and adhered light transmissive protection sheet 140 and wafer 160) can be obtained from the ultraviolet tape 182 of the frame body 180 in a direction D3. Each of the image sensors 160' is a single image sensing chip, such as a front-illuminated or back-illuminated CMOS image sensing chip.

Compared with the aforesaid embodiments and prior arts, when the light transmissive protection sheet is adhered to the wafer, the warpage of the light transmissive protection sheet is not easily happened, and the light transmissive carrier can be attached by static electricity and has transmittance, such that the light transmissive protection sheet can be easily aligned with the wafer and does not shift on the wafer. Moreover, when the wafer is ground, the strength of the light transmissive protection sheet and the wafer can be increased by the light transmissive carrier, such that the light transmissive protection sheet and the wafer are not easily broken. In addition, the hydrolytic temporary bonding layer is utilized to adhere the light transmissive protection sheet and the light transmissive carrier in the wafer packaging method. The adhesion force of the hydrolytic temporary bonding layer is eliminated in high temperature liquid. Therefore, after the wafer is ground, the light transmissive carrier can be easily separated from the light transmissive protection sheet. Since the strength of the light transmissive protection sheet and the wafer can be increased by the light transmissive carrier, the tape adhering process in the prior art can be omitted. The wafer packaging method can use a significantly thin light transmissive protection sheet to improve the transmittance thereof, such that the image detecting ability of chips formed by the diced wafer can be improved. Moreover, when the wafer is ground, the ground thickness of the wafer can be flexibly adjusted.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A wafer packaging method comprising:
   providing a light transmissive carrier;
   forming a hydrolytic temporary bonding layer on the light transmissive carrier;
   forming a first dam layer on the light transmissive carrier, wherein the first dam layer and the hydrolytic temporary bonding layer are located on a same surface of the light transmissive carrier, and the first dam layer does not overlap with the hydrolytic temporary bonding layer;
   bonding a first surface of a light transmissive protection sheet to the hydrolytic temporary bonding layer, such that the hydrolytic temporary bonding layer is located between the light transmissive protection sheet and the light transmissive carrier;

bonding a second surface of the light transmissive protection sheet facing away from the first surface to a third surface of a wafer, wherein the third surface of the wafer has a plurality of integrated circuit units;

immersing the light transmissive carrier, the hydrolytic temporary bonding layer, the light transmissive protection sheet, and the wafer in a high temperature liquid, such that adhesion force of the hydrolytic temporary bonding layer is eliminated; and obtaining the light transmissive protection sheet and the wafer from the high temperature liquid.

2. The wafer packaging method of claim 1, wherein a thickness of the first dam layer is smaller than a thickness of the hydrolytic temporary bonding layer.

3. The wafer packaging method of claim 1, further comprising:

forming a second dam layer on the second surface of the light transmissive protection sheet, wherein the second dam layer is bonded to the third surface of the wafer.

4. The wafer packaging method of claim 1, further comprising:

grinding a fourth surface of the wafer facing away from the third surface.

5. The wafer packaging method of claim 4, further comprising:

providing a frame body that has an ultraviolet tape, wherein the ultraviolet tape is located in an opening of the frame body; and adhering the ground fourth surface of the wafer to the ultraviolet tape.

6. The wafer packaging method of claim 5, further comprising:

dicing the light transmissive protection sheet and the ground wafer, such that the diced light transmissive protection sheet and the diced wafer forms a plurality of image sensors.

7. The wafer packaging method of claim 6, further comprising:

exposing the ultraviolet tape to ultraviolet to eliminate adhesion force of the ultraviolet tape; and obtaining the image sensors from the ultraviolet tape.

8. The wafer packaging method of claim 6, wherein each of the image sensors is a CMOS image sensing chip.

9. The wafer packaging method of claim 1, wherein the hydrolytic temporary bonding layer is made of a material that comprises acrylic.

10. The wafer packaging method of claim 1, wherein a thickness of the light transmissive protection sheet is in a range from 50 to 500 μm.

11. The wafer packaging method of claim 1, wherein a thickness of the light transmissive carrier is in a range from 300 to 500 μm.

12. The wafer packaging method of claim 1, wherein a thickness of the light transmissive carrier is greater than a thickness of the light transmissive protection sheet.

13. The wafer packaging method of claim 1, wherein strength of the light transmissive carrier is greater than strength of the light transmissive protection sheet.

14. A wafer packaging method comprising:

providing a light transmissive carrier;

forming a hydrolytic temporary bonding layer on the light transmissive carrier;

bonding a first surface of a light transmissive protection sheet to the hydrolytic temporary bonding layer, such that the hydrolytic temporary bonding layer is located between the light transmissive protection sheet and the light transmissive carrier;

forming a dam layer on a second surface of the light transmissive protection sheet facing away from the first surface;

bonding the dam layer to a third surface of a wafer, wherein the third surface of the wafer has a plurality of integrated circuit units;

immersing the light transmissive carrier, the hydrolytic temporary bonding layer, the light transmissive protection sheet, and the wafer in a high temperature liquid, such that adhesion force of the hydrolytic temporary bonding layer is eliminated; and obtaining the light transmissive protection sheet and the wafer from the high temperature liquid.

* * * * *